United States Patent
Schemmann et al.

(10) Patent No.: US 10,218,318 B2
(45) Date of Patent: Feb. 26, 2019

(54) AMPLIFIER WITH DIGITAL LINEARIZATION AND MULTIPLE OUTPUT STAGES

(71) Applicant: ARRIS Enterprises LLC, Suwanee, GA (US)

(72) Inventors: Marcel F. Schemmann, Maria Hoop (NL); Zhijian Sun, Avon, CT (US)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 15/655,392

(22) Filed: Jul. 20, 2017

(65) Prior Publication Data
US 2019/0028068 A1    Jan. 24, 2019

(51) Int. Cl.
| | | |
|---|---|---|
| *H03F 1/07* | (2006.01) | |
| *H03F 1/32* | (2006.01) | |
| *H04L 25/02* | (2006.01) | |
| *H04L 25/49* | (2006.01) | |
| *H04B 1/04* | (2006.01) | |

(52) U.S. Cl.
CPC ........... *H03F 1/327* (2013.01); *H03F 1/3247* (2013.01); *H04B 1/0475* (2013.01); *H04L 25/0204* (2013.01); *H04L 25/49* (2013.01); *H04B 2001/0433* (2013.01)

(58) Field of Classification Search
CPC ...................................................... H03F 1/3241
USPC ...................................... 330/149, 124 R, 295
See application file for complete search history.

(56) References Cited

U.S. PATENT DOCUMENTS

| | | | |
|---|---|---|---|
| 6,515,544 B1* | 2/2003 | Suzuki ..................... | H01Q 3/26 330/124 R |
| 7,961,045 B2* | 6/2011 | Morris .................. | H03F 1/0288 330/124 R |
| 8,145,066 B2 | 3/2012 | Painchaud et al. | |
| 9,041,469 B1* | 5/2015 | Simons ................. | H03F 1/0261 330/207 P |
| 9,191,064 B2 | 11/2015 | Schemmann et al. | |
| 9,608,691 B2 | 3/2017 | Schemmann et al. | |
| 2003/0095002 A1* | 5/2003 | Ha ......................... | H03F 1/3229 330/124 R |
| 2005/0141640 A1* | 6/2005 | Maruyama ............ | H03F 1/3241 375/297 |
| 2008/0309405 A1 | 12/2008 | Young et al. | |
| 2011/0191815 A1 | 8/2011 | Howlett et al. | |
| 2015/0372646 A1 | 12/2015 | Briffa et al. | |

FOREIGN PATENT DOCUMENTS

| | | |
|---|---|---|
| EP | 2204903 A1 | 7/2010 |
| WO | 2018/126010 A2 | 7/2018 |

OTHER PUBLICATIONS

ARRIS U.S. Appl. No. 15/591,051, filed May 9, 2017.
ARRIS U.S. Appl. No. 15/387,880, filed Dec. 22, 2016.
PCT Search Report & Written Opinion, Re: Application No. PCT/US2018/042892, dated Sep. 26, 2018.

* cited by examiner

*Primary Examiner* — Henry Choe
(74) *Attorney, Agent, or Firm* — Lori Anne D. Swanson

(57) ABSTRACT

Systems and methods that cancel distortion in the amplified outputs of a node by equalizing the distortion characteristics amplifiers in the node, so as to improve the effectiveness of predistortion applied to a downstream signal amplified by the node.

17 Claims, 5 Drawing Sheets

AMPLIFIER WITH DIGITAL LINEARIZATION AND MULTIPLE OUTPUT STAGES

CROSS REFERENCE TO RELATED APPLICATIONS

None.

BACKGROUND

The subject matter of this application generally relates to systems and methods that improve the performance of multiple amplifiers contained within a node of a CATV network.

Cable television (CATV) delivery systems provide a variety of media content, such as video, data, voice, or high-speed Internet services to subscribers. The CATV provider typically delivers the media content from a head end to its subscriber's client devices over a transmission network such as a coaxial network, a fiber optic network, or a hybrid fiber/coax (HFC) network. Requirements for data throughput (or bandwidth) in these CATV networks are growing exponentially as customers demand more content, data services, etc. Though improvements in encoding efficiencies and transport protocols have thus far allowed cable operators to keep pace with subscriber and competitive demands, it is important to continue the analysis of the various network elements that can enhance or inhibit the overall performance of CATV systems.

Generally (RF) amplifiers within the cable television network operate in what is referred to as a "class A" mode of operation, which provides a very high fidelity signal, often quantified in terms of signal-to-noise and signal-to-2nd, 3rd, 4th, 5th . . . harmonic distortion products. In a class A amplifier, the transistor is always biased "ON" so that it conducts during one complete cycle of the input signal waveform, producing minimum distortion and maximum amplitude to the output since there is no crossover distortion to the output waveform, even during the negative half of the cycle. However, because the transistor is always biased "ON," one of the main disadvantages of class A amplifiers is that their efficiency is very low as the constant and usually large bias currents cause a considerable amount of power to be lost. It is desirable to reduce power dissipation by minimizing the bias current of amplifiers be it class A amplifiers or more complex class AB or class B amplifiers but this does degrade the amplifier distortion performance such that some form of distortion cancellation is generally needed.

To avoid this excessive power loss, class B amplifiers may be used, which have a pair of transistors that each conduct alternatingly only for one half cycle of the input signal. Since the active devices are switched off for half the input cycle, the active device dissipates less power and hence the power efficiency is improved. However, since each active device truncates half the input signal and the output signal is the sum of the outputs of the active devices, such that the half waves are constructively added to full waves, cross-over distortion that occurs when one device switches off and the other switches on is high in class B amplifiers.

Class AB amplifiers similarly tend to produce distortion. In class AB amplifiers for RF applications, typically an output transformer is used where a pair of transistors are operated in a push-pull configuration and each of the transistors is driven with a signal set relative to ground, as opposed to some floating node. Each transistor alternatingly conducts a little more than one half cycle of the input signal such that for small signals there is an overlap region where both transistors are active, as in a class A amplifier with low bias. For large signals the operation is as with a class B amplifier. The small bias current for class A operation with small signals does increase power dissipation somewhat compared to a pure class B amplifier but it can still be much less than for a class A amplifier. A comparison between the input and a fraction of the output signals is used to generate a feedback signal that is theoretically used to reduce distortion. But in implementation this is often difficult. Feedback in an RF amplifier is generally limited, due to the high signal bandwidth that needs to be amplified. Too much delay in the feedback path combined with a high gain for the correction signal, as would be needed for good distortion suppression, will lead to amplifier oscillation, which produces distortions due to the transitions in the operating mode of the output transistors. Secondly, turning an RF transistor off can produce very high distortions when the transistor needs to be turned on again. This makes it difficult to use a class AB amplifier in a CATV application that requires low distortion and high RF bandwidth.

What is desired, therefore, are improved systems and methods for reducing distortion produced by amplifiers in CATV systems.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Physically, existing downstream CATV content originates on the network from a head end, within which is a Cable Modem Termination System (CMTS). In the CMTS there is typically a plurality of EdgeQAM units, which each receive encoded video signals, audio signals, and/or IP signals, and which each directly output a spectrum of amplitude-modulated analog signals at a defined frequency or set of frequencies to an RF combining network. The RF combining network in turn delivers the combined, modulated signals to a transmitter that converts the analog signals to optical signals and propagates those signals to a fiber optic network along a forward path to a receiver in a node. The node, in turn, converts the received optical signals back into electrical signals so that they may be delivered to subscribers through coaxial cables that terminate in the subscriber's homes. The node, conversely will also have equipment capable of receiving electrical signals from the subscribers, converting them to optical signals, and sending the optical signals to the CMTS along the fiber optic network, where the head end has a receiver capable of decoding and converting the signals back to the analog domain, respectively.

In the specification, the drawings, and the claims, the terms "forward path" and "downstream" may be interchangeably used to refer to a path from a head end to a node, a node to an end-user, or a head end to an end user. Conversely, the terms "return path", "reverse path" and "upstream" may be interchangeably used to refer to a path from an end user to a node, a node to a head end, or an end user to a head end. Also, it should be understood that, unless stated otherwise, the term "head end" will also encompass a "hub," which is a smaller signal generation unit remote from a head end, often used for community access channel insertion and other purposes, that generally mimics the functionality of a head end, but may typically not include equipment such as satellite dishes and telephone equipment.

Figure 1:
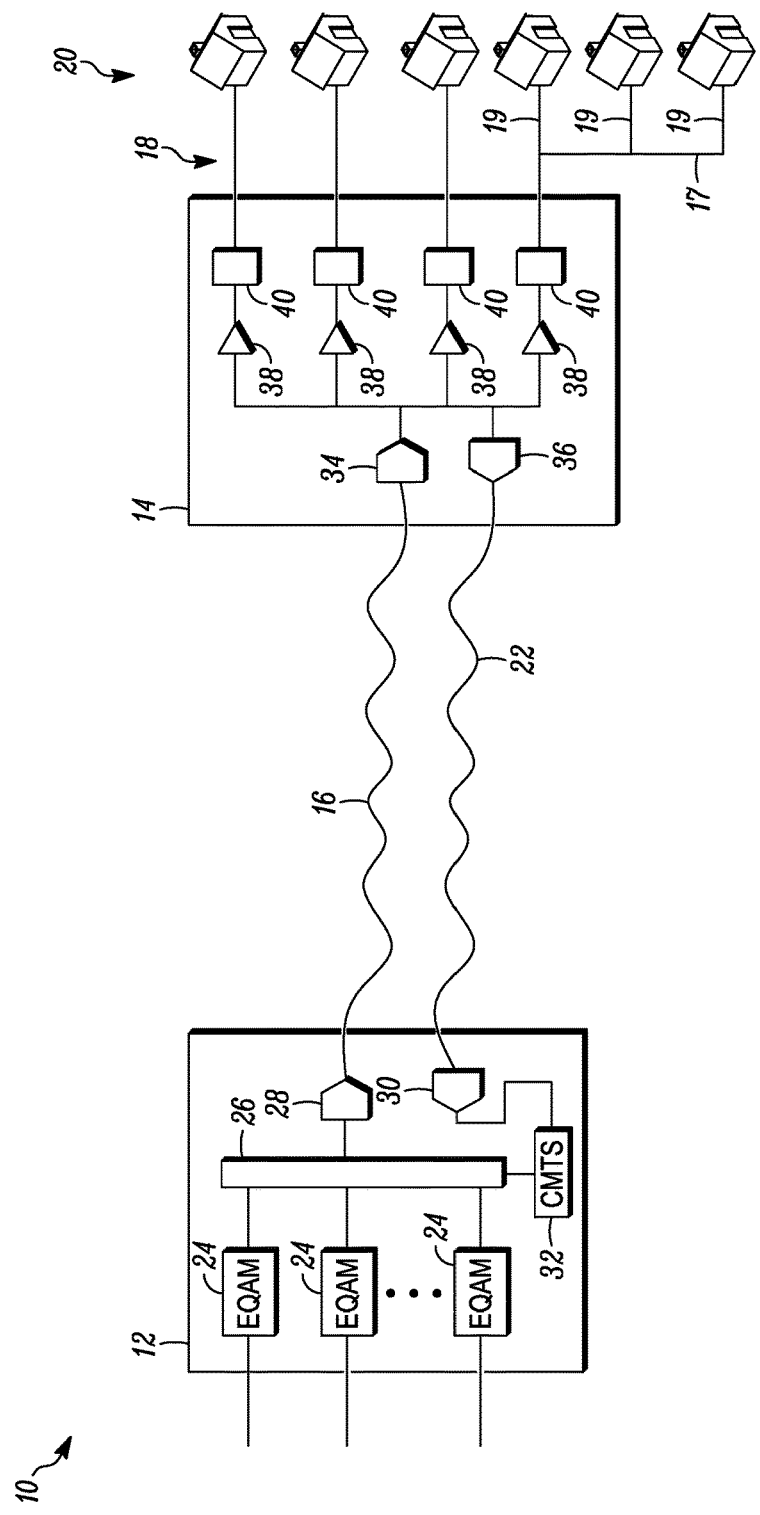
FIG. 1 shows an exemplary CATV system having a node housing a plurality of amplifiers that each deliver an amplified downstream signal to one or more subscribers.

Referring to FIG. 1, a CATV Hybrid Fiber-Coaxial (HFC) network 10 may include a head end 12 that delivers content over a forward path to a node 14 using an optical transmission line 16. The node 14 may in turn deliver content to a plurality of subscribers 20 over a coaxial network 18. Subscriber's homes are typically connected to the node 14 using trunk cables 17 and feeder cable or "taps" 19. The HFC network 10 may likewise transmit signals over a return path from each of the subscribers 20 to the node 14 through the coaxial network 18, which in turn transmits the return path signal to the head end 12 through an optical transmission line 22.

The head end 12 may preferably modulate a plurality of cable channels using one or more EdgeQAM units 24. The respective channels may be combined by an RF combining network 26 that multiplexes the signals and uses the multiplexed signal to modulate an optical transmitter 28 (e.g., a laser) that delivers the optical signal to transmission line 16. The head end 12 may also include an optical receiver 30 that receives return path signals from the optical transmission line 22 and delivers the return path signals to a Cable Modem Termination System (CMTS) 32, which instructs each of the cable modems when to transmit return path signals, such as Internet protocol (IP) based signals, and which frequency bands to use for return path transmissions. The CMTS 32 demodulates the return path signals, translates them into (IP) packets, and redirects them to a central switch (not shown) that transmits the IP packets to an IP router for transmission across the Internet. It should be understood by those skilled in the art that this configuration may be modified in any number of manners. For example, one or more of the EQAM units may be analog modulated or digitally modulated, or may be directly modulated in a Converged Cable Access Platform (CCAP). Similarly, the head end may include an A/D converter between the RF combining network 26 and the optical transmitter 28 so as to modulate the optical signal to the node using a digital rather than an analog signal.

The node 14 includes an optical receiver 34 to receive a forward path signal from the head end 12 over the optical transmission line 16, along with an optical transmitter 36 to send the return path signals to the head end 12 over the optical transmission line 22. The optical receiver 34 is preferably capable of de-multiplexing a received optical signal and using the de-multiplexed signals to modulate respective RF signals sent to subscribers 20 through a network of amplifier units 38 and diplexers 40.

Figure 2:
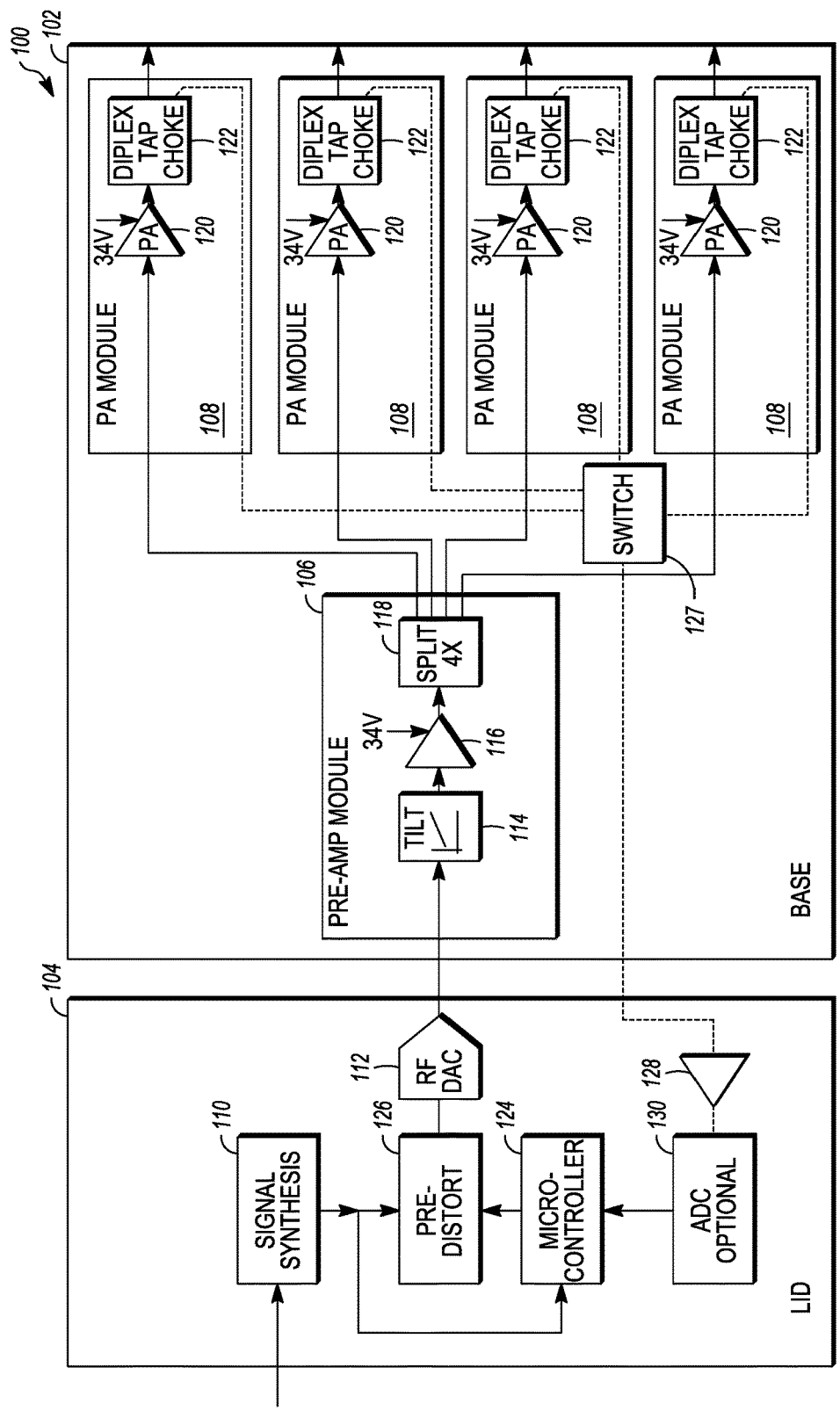
FIG. 2 shows an exemplary node that uses feedback from each of the amplifiers in the node to pre-distort the downstream signal in a manner that tends to cancel the distortion of the amplifiers in the node.

As noted previously, the amplifier units 14 may be subject to undesirable distortion. FIG. 2 shows an improved node 100 that reduces the distortion in the amplified output of the node. The node 100 may be structurally composed of a base 102 and a lid 104. The base 102 may include a preamplification module 106 and a plurality of amplifier modules 108. The lid 104 may include a signal synthesis module 110 that receives the incoming signal from a head end, where that incoming signal can also consist of one or more data streams and synthesizes that signal to separate video, data, and other services that are multiplexed within the input signal. The synthesized digital signal is fed to a digital-to-analog converter (DAC) 112 which converts the digital signal to an analog signal, and then forwards the analog signal to the preamplification module 106.

Those of ordinary skill in the art will understand that the physical bifurcation of the node 100 into a base 102 and a lid 104 is illustrated for convenience, and other nodes may be constructed differently. Moreover, the depiction of certain components of the node, e.g. the preamplification module 106 as being a part of the base and other components, e.g. the DAC 112, as being part of the lid 104 is illustrative only, and other nodes having a base 102 and a lid 104 may be configured for example, with all components in the base 102, or different components in either the base or the lid than those depicted in FIG. 2.

The preamplification module 106 includes a preamplifier 116 that applies gain to the signal received from the DAC 112. Signals propagated over a transmission line will attenuate more rapidly at high frequencies than low frequencies. To compensate for this phenomenon, the preamplification module 106 preferably includes a tilt adjustment module 114 that changes the gain of the preamplifier 116 as a function of frequency, e.g. the tilt adjustment module may adjust the preamplifier 116 to apply more gain as a function of increasing frequency. The particular "tilt" applied to the preamplifier 116 will typically vary from one node 100 to another depending on factors such as the properties and length of the transmission lines from the node to the customers. The output of the preamplifier 116 is provider to a splitter 118 that splits the preamplified signal into a plurality of separate signals, each provided to a respective one of the plurality of amplification modules 108.

Each of the amplification modules 108 includes an amplifier 120 that further amplifies the downstream signal before propagating the amplified signal to a subscriber or group of subscribers along a tap to the subscriber(s). Each power amplifier is powered by a bias signal, shown in FIG. 2 as 34V, but those of ordinary skill in the art will realize that different amplifiers may be set at different bias points. Each amplification module 108 should also preferably include, at its output, a diplex filter that separates the downstream signal to subscribers from upstream signals received from the subscribers, along with a power choke used separate the RF up- and downstream signals at the amplifier output from a low frequency power signal provided to or passed by the amplifier. The tap, diplex filter, and choke are all commonly represented by unit 122 (hereinafter referred to as a "tap" for convenience).

In applications with reduced amplifier output distortion, the attenuated downstream output that is present at the tap 122 of each amplifier is preferably provided as feedback to a microcontroller 124 in the lid via a switch 126 that sequentially samples each amplification module 108. The feedback signals may be optionally amplified by an amplifier 128 and converted by an analog-to-digital (ADC) converter 130 prior to being provided to the microcontroller 124. The microcontroller can perform digital signal processing operations on the sample values obtained from the microcontroller where these operations may also be performed in a dedicated processor or a field programmable gate array or application specific IC. The microcontroller 124 preferably uses the respective feedback signals from the amplification modules 108 to determine the distortion characteristics of those amplification modules and drive a pre-distortion module 126 where the pre-distortion module may be implemented in digital signal processing, taking in synthesized signals from signal synthesis 110 and putting out pre-distorted signal samples to a DA converter 112. For example, the microcontroller 124 can compare the synthesized input signal to the node 100 received from the synthesizer 110 to the output signals of each amplification module 108, after those output signals are optionally digitized and attenuated to cancel the gain and tilt applied by the preamplifier 116 and the amplifiers 120, thus allowing a direct comparison to the synthesized input signal to the node from digital synthesis 110. The microcontroller 124 can thereby use the difference of that comparison to adjust settings in pre-distortion signal processing 126 to pre-distort the input to the DAC 112 so as to counteract the distortion effects of the amplification modules 108.

Figure 3:
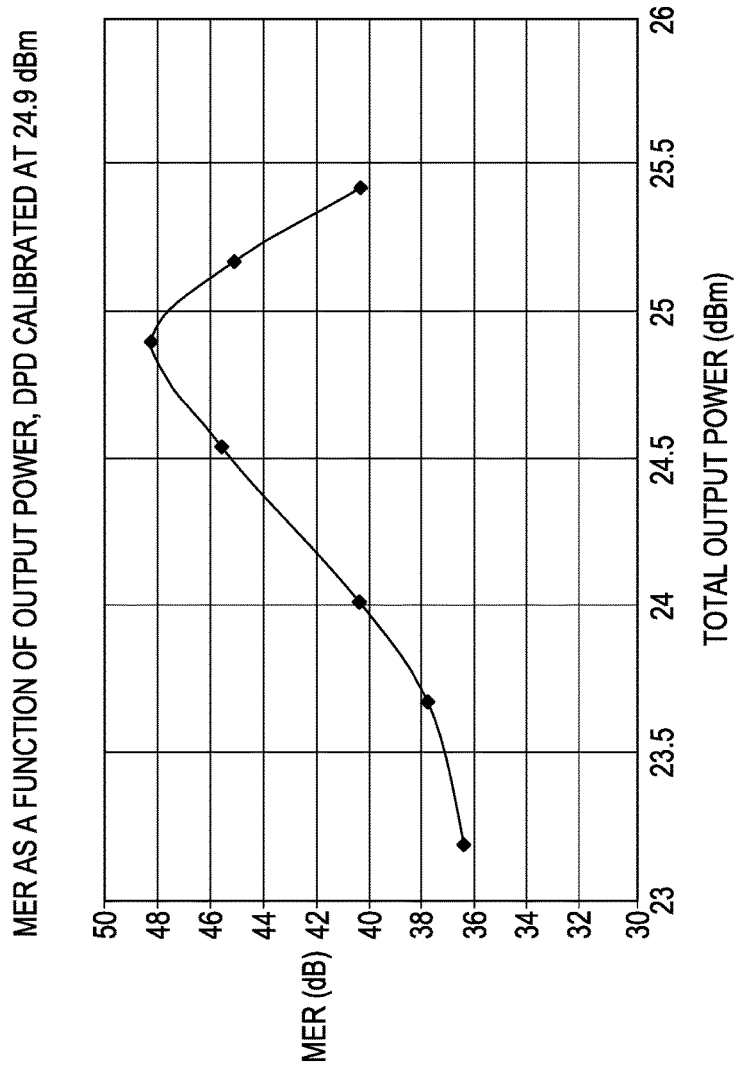
FIG. 3 shows the efficiency of the system of FIG. 2 in cancelling distortion.

The distortion generated by each amplification module 108 may often differ from one to another, however, since distortion is highly dependent on the actual output signal level of each amplifier. Even the small differences in design tolerances of amplifiers may result in significant differences in the distortion. Furthermore, amplifiers may have temperature-dependent distortion characteristics that differ from each other, meaning that as the temperature of the node 100 changes, the differences in the distortion characteristics of the amplifiers within that node will change, as well. Referring to FIG. 3, for example, a change in the output level of 0.5 dB can cause a change in the modulation error ratio (MER) of in excess of 8 dB. Amplifier gain typically varies by more than 0.5 dB between one unit to another and gain stability over temperature can also vary by more than 0.5 dB.

As a consequence of these differences in distortion, the microcontroller 124 shown in FIG. 2 will often not be able to adjust settings in pre-distortion signal processing 126 to cancel all the distortion produced by a node 100 having multiple amplifiers that independently amplify the same signal. Instead, the microcontroller 124 must seek a compromise predistortion signal that keeps the total distortion of every amplifier module 108 within acceptable limits while also minimizing the sum of all distortion output by the node 100.

Figure 4:
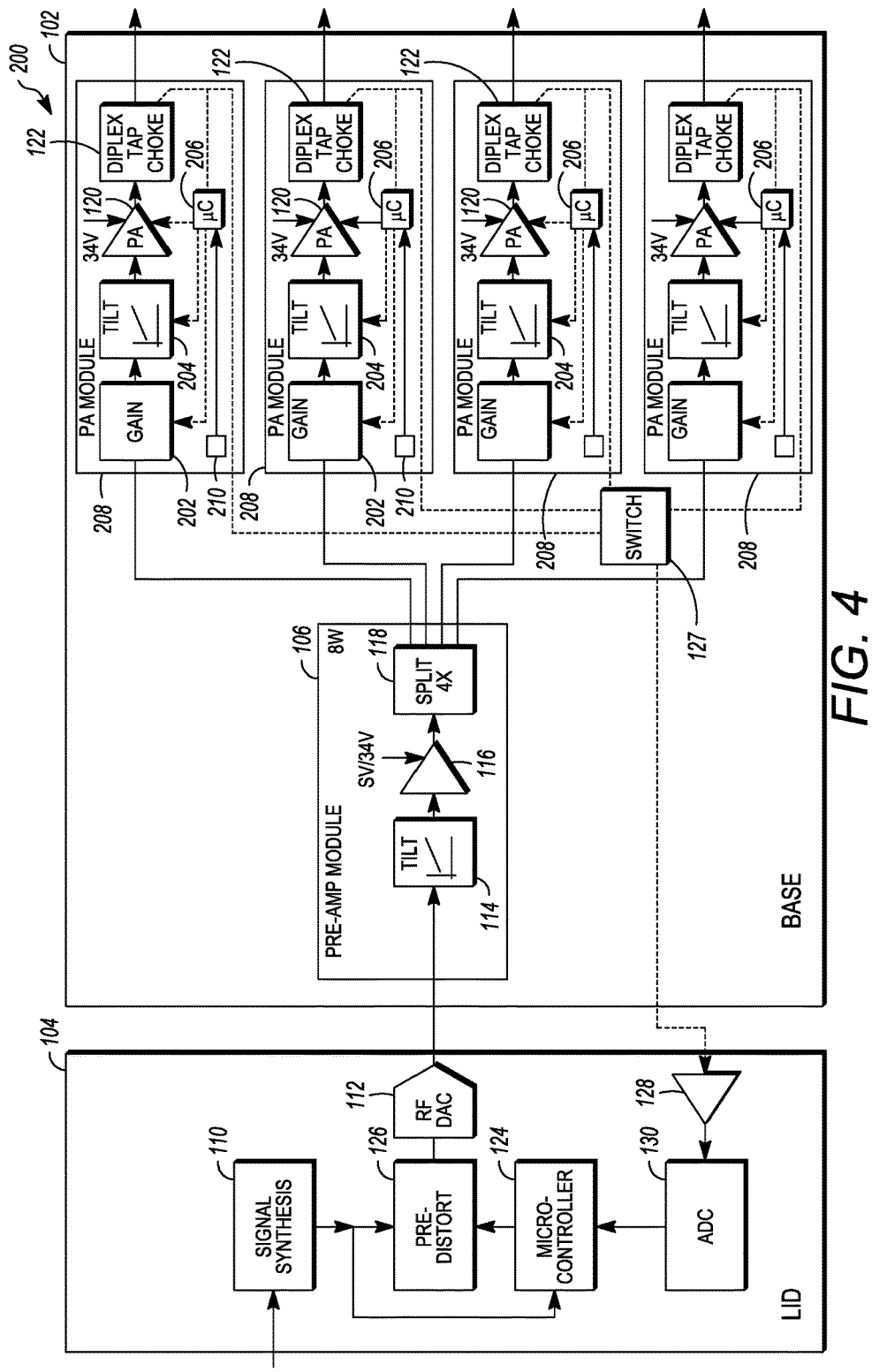
FIG. 4 shows a first alternate embodiment of a node where each amplifier includes an additional feedback loop used to modify its own amplification parameters in a manner that equalizes the distortion characteristics between a plurality of amplifiers in the node.

FIG. 4 shows an alternate embodiment of a node 200 that, like the node 100 of FIG. 2, includes a plurality of amplification modules 208 that are each driven by signal from a common DAC 112 and preamplified by a preamplifier 106. Unlike the node 100 of FIG. 2, however, each of the plurality of amplification modules 208 has its own gain control module 202, tilt control module 204, and microprocessor 206 that receives the feedback signal from the tap 122 of the respective amplification module 208 and uses that feedback signal to modulate the gain and tilt of its respective amplifier 120, as well as to modulate a "balance" input to the amplifier. In this manner, and as further described below, each amplifier module 208 may use feedback from its own tap 122 to regulate its gain, frequency response, and distortion characteristics to so that the distortion behavior of all the amplifiers in the node 200 closely mimic each other.

For example, as noted above, the distortion produced by an amplifier changes significantly as a function of its power output level, which may itself vary as a function of frequency due to the tilt of the amplifier. The microcontroller 206 in each amplification module 208 may therefore monitor its own output and control the gain control module 202 and tilt control module 204 to keep the gain and tilt of the amplifier at a target, preselected value common to all the amplification modules 208 in the node 200.

Moreover, in a push-pull amplifier the balance of its two output transistors dominates second order distortion behaviour such that when both transistors behave equally, or "balanced" to signals amplified by each of the transistors, the second order distortion is eliminated; thus the microcontroller may similarly regulate such distortion characteristics by modulating the balance signal to its respective amplifier 120. Such a balance signal may for instance change the DC bias current of at least one of the transistors in a push-pull amplifier relative to another transistor in the amplifier to make them behave equal to signals amplified by each transistor such that second order distortion is eliminated. The distortion behavior of the amplifiers may also be modified with other analog linearizers know in the art, which may be controlled by one or more "balance" signals.

In this manner, the differences in distortion caused by the plurality of amplification modules 208 in the node 200 may be significantly reduced, i.e. the distortion behavior of the plurality of amplification modules may be equalized so that the microcontroller 124 in the lid 104 of the node 200, which also receives feedback from the output of the amplification modules 208 via the switch 126 may be much more effective in cancelling the distortion out of the node 200 via the pre-distortion signal it controls by adjusting settings in pre-distortion signal processing 126 based on that feedback. As used in the specification and claims, the term "equalized," unless expressly stated otherwise, does not connote precise identity between the distortion characteristics of the plurality of amplification modules, but instead indicates that the difference one or more distortion characteristics of the plurality of amplification modules is lessened.

In some embodiments, each microcontroller 206 may store measured information of the performance characteristics of its own associated amplification module 208, and optionally performance characteristic of the other amplification modules 208 in the node 200. This measured information may be useful in circumstances where the distortion behavior of an amplification module varies as a function of power output, temperature etc., and the microprocessor 206 may accordingly use such information to select an appropriate level of a gain, a tilt, a bias or a "balance" signal to the amplifier 120, and in such embodiments, may receive information from an optional temperature sensor 210.

Stored, measured performance characteristics of the amplification modules 208 may also be useful in circumstances where the distortion behavior of the differing amplification modules 208 vary greatly relative to each other, as say temperature changes. In such embodiments, for example, to account for circumstances where temperature changes in the node 200 would otherwise prevent one of the amplification modules from achieving the target distortion behavior, the microcontrollers 206 may receive information from the optional temperature sensor 210 and use that information to modify the target performance characteristics of their respective amplification modules 208 to one that all amplification modules 208 in the node 200 may achieve at that temperature. Those of ordinary skill in the art will appreciate that, although FIG. 4 shows each amplifier module 208 as including its own temperature sensor 210, in embodiments including such a temperature sensor, the amplification modules 208 may each receive information from a single, common temperature sensor.

Figure 5:
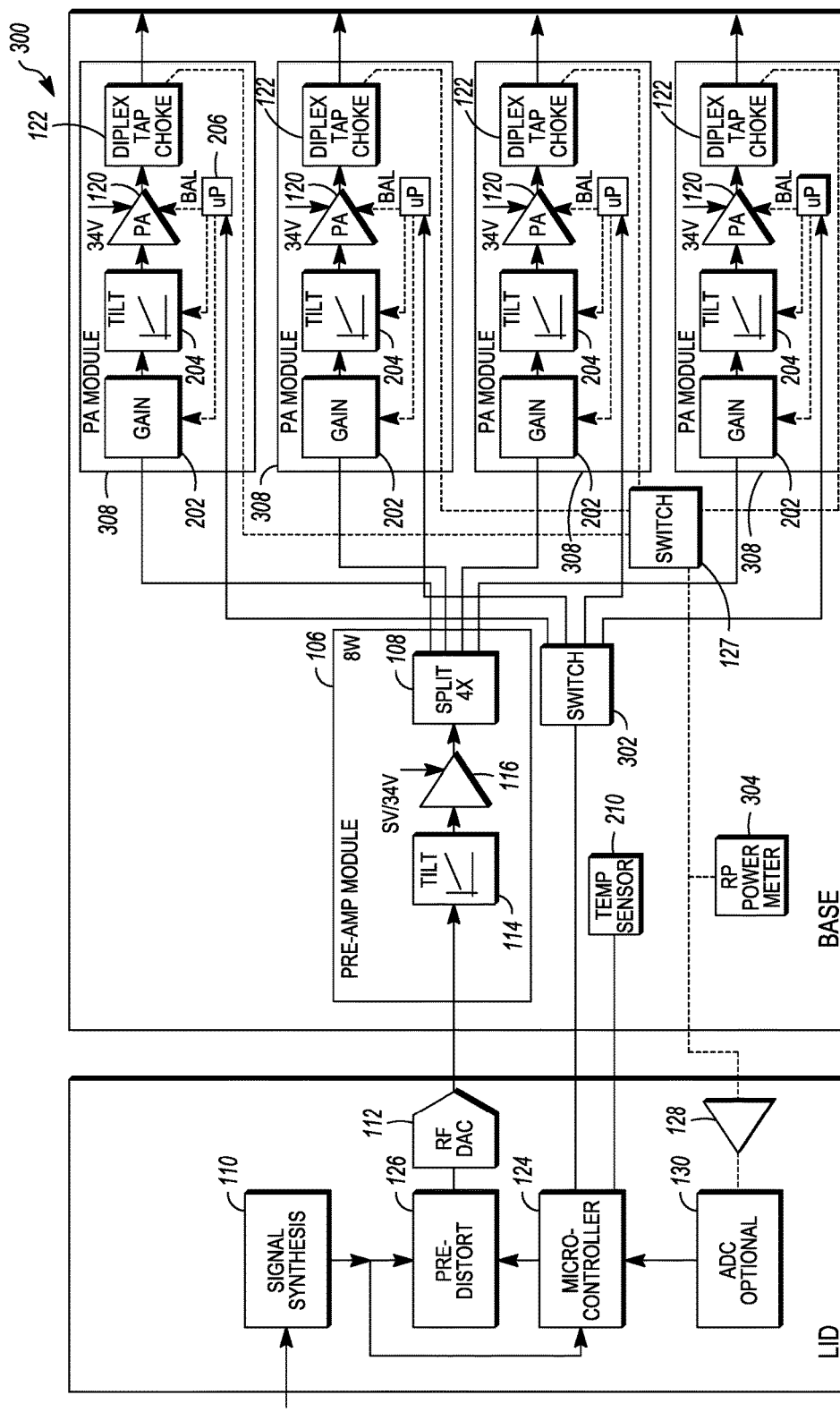
FIG. 5 shows a second alternate embodiment where each amplifier includes an additional feedback loop used to modify its own amplification parameters in a manner that equalizes the distortion characteristics between a plurality of amplifiers in the node.

FIG. 5 shows another alternate embodiment of a node 300 that, similar to that of node 200 in FIG. 4, uses feedback from the taps 122 of amplification modules 308 to drive microprocessors 206 in each amplification module, which in turn drives the gain control module 202 and tilt control module of their own respective amplification modules 308 as well as modulate a "balance" input to the amplifier 124. Unlike the system 200 of FIG. 4, however, the feedback signals from the taps 122 of the respective amplification modules 308 are only provided to the microcontroller 124 in the lid 104 of the node 300, and the microcontrollers 206 of the individual amplification modules 308 are each individually controlled by the microcontroller 124 via a second switch 302. It will be appreciated by those skilled in the art that any combination of the systems in FIGS. 4 and 5 may also be constructed. Furthermore, those of ordinary skill in the art will appreciate that, although FIG. 5 depicts a switch 302 as a device allowing the microcontroller 124 to control the respective microcontrollers 206, other devices may also be used, such as busses. Similarly, a bus or other appropriate device may be used instead of the switch 127 shown in FIGS. 2, 4, and 5. In some such embodiments a single bus may be used in place of both switch 127 and switch 302.

In some embodiments, the microcontroller 124 may receive information from a temperature sensor 210 located in the base 102 of the node 300, which may be used by the microcontroller 124 to modulate the behavior of the microcontrollers 206 using stored data pertaining to the performance characteristics of the amplification modules 308. Similarly, an RF power monitoring circuit 304, such as a RF power meter may provide information to the microcontroller 124 indicating the power levels of the amplification modules 308 so as to modulate the behavior of the microcontrollers 206 using stored data. In some embodiments, this monitoring may take place in the digital domain via the ADC 130. The microcontroller 124 obtains data about the behavior of each individual output of the node and can instruct any one of the microcontrollers 206 to adjust a parameter in the amplifier module 308 to make it behave more similar to other amplifier modules 308 so that a better compromise can be found for the pre-distortion signals generated to reduce node output port distortion.

It will be appreciated that the invention is not restricted to the particular embodiment that has been described, and that variations may be made therein without departing from the scope of the invention as defined in the appended claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

The invention claimed is:

1. A node for a CATV distribution system, the node providing a common signal to a plurality of amplifiers, each amplifier amplifying the common signal and delivering the amplified signal to a respective set of one or more subscribers, the node comprising:
 a first controller that controls pre-distortion of the common signal so as to cancel at least a portion of a distortion caused by each of the plurality of amplifiers; and
 a plurality of second controllers, each second controller associated with a respective one of the plurality of amplifiers and modifying at least one of a gain, a frequency response, and a balance of its respective amplifier in response to a feedback signal of the output of the respectively associated one of the plurality of amplifiers;
 where at least one of the first controller and the plurality of second controllers store predetermined performance characteristics of the plurality of amplifiers,
 where the respective modifications by the respective controllers equalize the distortion among the plurality of amplifiers; and
 at least one temperature sensor and where at least one of the first controller and the plurality of second controllers use the output of the at least one temperature sensor and the stored performance characteristics to equalize the distortion among the plurality of amplifiers.

2. The node of claim 1 including a preamplifier that pre-amplifies the common signal and a splitter that provides the preamplified common signal to each of the amplifiers.

3. The node of claim 1 where the feedback signal of each respective amplifier is provided to the second controller associated with the respective amplifier providing the feedback where the second controller monitors the feedback signal.

4. The node of claim 3 where the feedback signal is provided to the first controller.

5. The node of claim 1 where first controller controls each of the plurality of second controllers.

6. The node of claim 1 where the predistortion provided by the first controller is based on the equalization provided by the plurality of second controllers.

7. A method of reducing the distortion at the outputs of a node having a plurality of amplifiers, the method comprising:
 receiving a downstream CATV signal and splitting that downstream signal to a plurality of amplifiers in the node, each amplifier respectively distorting the split downstream signal;
 storing predetermined performance characteristics of the plurality of amplifiers;
 using the output of a temperature sensor and the stored predetermined performance characteristics, equalizing the distortion between the plurality of amplifiers using respective feedback signals from each of the plurality of amplifiers; and
 pre-distorting the downstream signal to cancel at least a portion of the equalized distortion of the plurality of amplifiers.

8. The method of claim 7 including the step of equalizing the distortion between the plurality of amplifiers by adjusting at least one of a gain, a frequency response, and a balance of at least one of the plurality of amplifiers based on the feedback from the at least one of the plurality of amplifiers.

9. The method of claim 7 including the step of pre-distorting the downstream signal using the respective feedback signals from the plurality of amplifiers.

10. The method of claim 7 including a pre-amplifying the downstream signal prior to splitting the downstream signal.

11. The method of claim 7 including providing the feedback signal of each respective amplifier to a controller in the respective amplifier.

12. The method of claim 11 including providing the feedback signal to a second controller that pre-distorts the downstream signal.

13. The method of claim 7 where a first controller pre-distorts the downstream signal and controls each of a plurality of second controllers, each second controller in a respective one of the plurality of amplifiers, and each second controller adjusting at least one of a gain, a frequency response, and a balance of its respectively associated amplifier.

14. The method of claim 7 including storing predetermined performance characteristics of the plurality of amplifiers.

15. An amplifier in a node that receives a pre-distorted downstream signal from a splitter in the node, the amplifier comprising:

an input for receiving a common signal from a node with at least a portion of a distortion caused by another amplifier canceled in the common signal;

a controller that adjusts at least one of a gain, a tilt, and a balance of the amplifier, based on a response of a measured feedback signal output from the amplifier, in a manner that reduces the difference between an output of the amplifier and an output of a second amplifier in the node, wherein the controller stores predetermined performance characteristics of the amplifier, wherein the controller contributes to equalize a distortion among a plurality of amplifiers including said amplifier using an output of a temperature sensor and the predetermined performance characteristics of the amplifier.

16. The amplifier of claim 15 including the temperature sensor.

17. The amplifier of claim 15 where the controller is controlled by a second controller that pre-distorts the downstream signal using the measured output of the amplifier.

* * * * *